United States Patent

Takamine (10) Patent No.: US 10,148,248 B2
(45) Date of Patent: Dec. 4, 2018

(54) LONGITUDINALLY COUPLED RESONATOR-TYPE SURFACE ACOUSTIC WAVE FILTER

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 132 days.

(21) Appl. No.: 15/376,714

(22) Filed: Dec. 13, 2016

(65) Prior Publication Data

US 2017/0093371 A1    Mar. 30, 2017

Related U.S. Application Data

(63) Continuation of application No. PCT/JP2015/067196, filed on Jun. 15, 2015.

(30) Foreign Application Priority Data

Jun. 26, 2014  (JP) ................................. 2014-130987

(51) Int. Cl.
*H03H 9/145*   (2006.01)
*H03H 9/64*    (2006.01)
(Continued)

(52) U.S. Cl.
CPC ...... *H03H 9/1457* (2013.01); *H03H 9/02559* (2013.01); *H03H 9/02566* (2013.01);
(Continued)

(58) Field of Classification Search
CPC ........... H03H 9/02559; H03H 9/02566; H03H 9/02574; H03H 9/1457; H03H 9/14582;
(Continued)

(56) References Cited

U.S. PATENT DOCUMENTS 5,235,233 A * 8/1993 Yamamoto ......... H03H 9/02976
                                                310/313 A
7,589,451 B2 * 9/2009 Morita ............... H03H 9/02551
                                                310/313 R
(Continued)

FOREIGN PATENT DOCUMENTS

JP    2002-111432 A    4/2002
JP    2003-8390 A      1/2003
(Continued)

OTHER PUBLICATIONS

English language machine translation of JP 2015-109574, published Jun. 11, 2015, 16 pages.*

(Continued)

*Primary Examiner* — Barbara Summons
(74) *Attorney, Agent, or Firm* — Keating & Bennett, LLP (57) ABSTRACT

A longitudinally coupled resonator-type surface acoustic wave filter includes a low acoustic velocity film and a piezoelectric film stacked over a high acoustic velocity component in which a bulk wave propagates at an acoustic velocity higher than an acoustic velocity of an elastic wave that propagates in the piezoelectric film. IDT electrodes are provided on one surface of the piezoelectric film. The longitudinally coupled resonator-type surface acoustic wave filter uses a SH wave. At least one of the IDT electrodes has a duty factor that is adjusted over an entire length of the one of the IDT electrodes in the direction of elastic wave propagation to suppress a Rayleigh wave spurious response.

17 Claims, 4 Drawing Sheets (51) Int. Cl.
    *H03H 9/72*     (2006.01)
    *H03H 9/02*     (2006.01)

(52) U.S. Cl.
    CPC .......... *H03H 9/02574* (2013.01); *H03H 9/64* (2013.01); *H03H 9/6436* (2013.01); *H03H 9/725* (2013.01)

(58) Field of Classification Search
    CPC .......... H03H 9/25; H03H 9/64; H03H 9/6433; H03H 9/6436; H03H 9/6489; H03H 9/725
    USPC .......................................... 333/133, 193–196
    See application file for complete search history.

(56) References Cited

U.S. PATENT DOCUMENTS

| | | | | |
|---|---|---|---|---|
| 7,750,533 | B2* | 7/2010 | Owaki | H03H 9/14538 |
| | | | | 310/313 B |
| 7,804,221 | B2* | 9/2010 | Nishiyama | H03H 9/02559 |
| | | | | 310/313 A |
| 2002/0021195 | A1 | 2/2002 | Takamine | |
| 2002/0175783 | A1 | 11/2002 | Watanabe et al. | |
| 2004/0077325 | A1 | 4/2004 | Takamine | |
| 2011/0199163 | A1 | 8/2011 | Yamanaka | |
| 2013/0285768 | A1 | 10/2013 | Watanabe et al. | |
| 2014/0203893 | A1* | 7/2014 | Kando | H03H 9/02574 |
| | | | | 333/187 |
| 2015/0028720 | A1 | 1/2015 | Kando | |

FOREIGN PATENT DOCUMENTS

| | | |
|---|---|---|
| JP | 2004-166213 A | 6/2004 |
| JP | 2006-319679 A | 11/2006 |
| JP | 2015-109574   * | 6/2015 |
| WO | 2010/047114 A1 | 4/2010 |
| WO | 2012/086639 A1 | 6/2012 |
| WO | 2013/141168 A1 | 9/2013 |

OTHER PUBLICATIONS

Official Communication issued in corresponding International Application PCT/JP2015/067196, dated Aug. 4, 2015.

* cited by examiner

LONGITUDINALLY COUPLED RESONATOR-TYPE SURFACE ACOUSTIC WAVE FILTER

CROSS REFERENCE TO RELATED APPLICATIONS

This application claims the benefit of priority to Japanese Patent Application No. 2014-130987 filed Jun. 26, 2014 and is a Continuation Application of PCT Application No. PCT/JP2015/067196 filed on Jun. 15, 2015. The entire contents of each application are hereby incorporated herein by reference.

BACKGROUND OF THE INVENTION

1. Field of the Invention

The present invention relates to a longitudinally coupled resonator-type surface acoustic wave filter that uses shear horizontal (SH) waves.

2. Description of the Related Art

In related art, surface acoustic wave devices are widely used for applications such as resonators and bandpass filters. International Publication No. 2012/086639 discloses an elastic wave device using SH waves. This elastic wave device includes a high acoustic velocity layer, a low acoustic velocity film, a piezoelectric film, and an interdigital transducer (IDT) electrode stacked in the stated order over a support substrate. The ability of this device to confine the energy of SH waves is supposed to provide an increased Q factor.

In the elastic wave device described in International Publication No. 2012/086639, not only SH waves but also Rayleigh waves (P+SV waves) are confined. Thus, fabricating a longitudinally coupled resonator-type surface acoustic wave filter by using the stacked structure described in International Publication No. 2012/086639 leads to the appearance of large spurious responses caused by Rayleigh waves.

SUMMARY OF THE INVENTION

Preferred embodiments of the present invention provide a longitudinally coupled resonator-type surface acoustic wave filter that allows Rayleigh wave spurious level to be reduced.

A longitudinally coupled resonator-type surface acoustic wave filter according to a preferred embodiment of the present invention is a longitudinally coupled resonator-type surface acoustic wave filter which includes a piezoelectric film, the longitudinally coupled resonator-type surface acoustic wave filter using a SH wave and including a high acoustic velocity component in which a bulk wave propagates at an acoustic velocity higher than the acoustic velocity of an elastic wave that propagates in the piezoelectric film, a low acoustic velocity film stacked on the high acoustic velocity component and in which a bulk wave propagates at an acoustic velocity lower than the acoustic velocity of a bulk wave that propagates in the piezoelectric film, and the piezoelectric film stacked on the low acoustic velocity film, and a plurality of IDT electrodes located on one surface of the piezoelectric film to provide the longitudinally coupled resonator-type surface acoustic wave filter. At least one of the plurality of IDT electrodes has a duty factor that is adjusted over an entire length of the at least one IDT electrode in the direction of elastic wave propagation to suppress a Rayleigh wave spurious response.

In a specific aspect of a longitudinally coupled resonator-type surface acoustic wave filter according to a preferred embodiment of the present invention, the at least one IDT electrode has a duty factor that is not uniform over the entire length in the direction of elastic wave propagation.

In another specific aspect of a longitudinally coupled resonator-type surface acoustic wave filter according to a preferred embodiment of the present invention, in the at least one IDT electrode, the ratio of a duty factor in a portion of maximum duty factor to a duty factor in a portion of minimum duty factor is in a range of equal to or greater than about 1.04 and equal to or less than about 2.5, for example.

In still another specific aspect of a longitudinally coupled resonator-type surface acoustic wave filter according to a preferred embodiment of the present invention, the at least one IDT electrode includes all of the plurality of IDT electrodes.

In yet still another specific aspect of a longitudinally coupled resonator-type surface acoustic wave filter according to a preferred embodiment of the present invention, the longitudinally coupled resonator-type surface acoustic wave filter further includes a support substrate stacked on a surface of the high acoustic velocity component opposite to the low acoustic velocity film.

In further still another aspect of a longitudinally coupled resonator-type surface acoustic wave filter according to a preferred embodiment of the present invention, the high acoustic velocity component includes a high acoustic velocity support substrate in which a bulk wave propagates at an acoustic velocity higher than the acoustic velocity of the elastic wave that propagates in the piezoelectric film.

Longitudinally coupled resonator-type surface acoustic wave filters according to various preferred embodiments of the present invention effectively reduces Rayleigh wave spurious levels in obtaining filter characteristics by use of a SH wave. Therefore, favorable filter characteristics are obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be further elucidated from the following description of various preferred embodiments of the present invention with reference to the drawings.

Figure 1A:
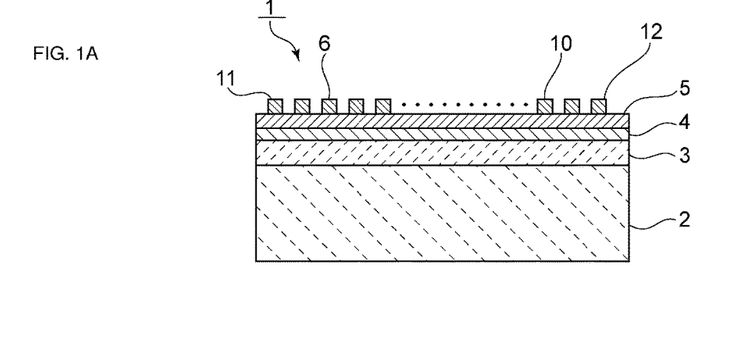
FIG. 1A and FIG. 1B are respectively a schematic front sectional view of the stacked structure of a longitudinally coupled resonator-type surface acoustic wave filter according to a first preferred embodiment of the present invention, and an enlarged front view of an IDT electrode included in the first preferred embodiment of the present invention.
Figure 1B:
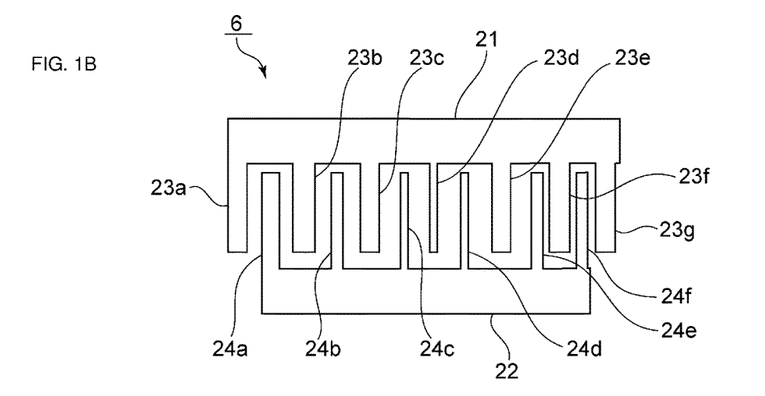

FIG. 1A is a schematic front sectional view of a stacked structure of a longitudinally coupled resonator-type surface acoustic wave filter according to a first preferred embodiment of the present invention, and FIG. 1B is an enlarged front view of an IDT electrode included in the first preferred embodiment.

As illustrated in FIG. 1A, a longitudinally coupled resonator-type surface acoustic wave filter 1 includes a support substrate 2. A high acoustic velocity film 3, which defines and functions as a high acoustic velocity component, a low acoustic velocity film 4, and a piezoelectric film 5 are stacked in the stated order over the support substrate 2. An electrode structure that defines the longitudinally coupled resonator-type surface acoustic wave filter is provided on the upper surface of the piezoelectric film 5. The electrode structure may be provided on the lower surface of the piezoelectric film 5.

Figure 2:
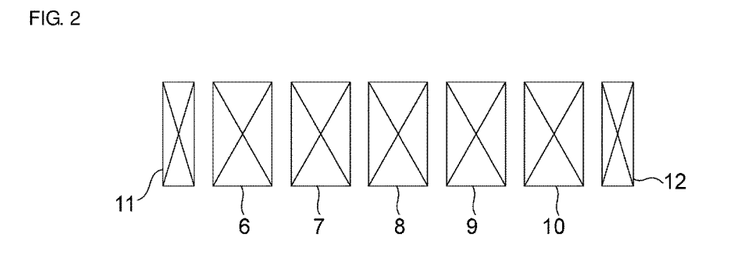
FIG. 2 is a schematic plan view of the longitudinally coupled resonator-type surface acoustic wave filter used in the first preferred embodiment of the present invention.

The electrode structure is illustrated in schematic plan view in FIG. 2. First to fifth IDT electrodes 6 to 10 are arranged in the propagation direction of the surface acoustic wave. Reflectors 11 and 12 are disposed on both sides of the first to fifth IDT electrodes 6 to 10 in the propagation direction of the surface acoustic wave. The above configuration provides the longitudinally coupled resonator-type surface acoustic wave filter 1 of a 5-IDT type.

In FIG. 2, each of the IDT electrodes 6 to 10 and the reflectors 11 and 12 is schematically depicted in the form of a rectangle with its diagonals intersecting each other, for example.

The support substrate 2 may be formed by using a suitable insulator or dielectric. Examples of such a material include a piezoelectric such as sapphire, lithium tantalate, lithium niobate, or quartz, various kinds of ceramics such as alumina, magnesia, silicon nitride, aluminum nitride, silicon carbide, zirconia, cordierite, mullite, steatite, or forsterite, a dielectric such as glass, a semiconductor such as silicon or gallium nitride, and resin.

The term high acoustic velocity film as used herein refers to a film in which a bulk wave propagates at an acoustic velocity higher than the acoustic velocity of the surface acoustic wave or boundary wave that propagates in the piezoelectric film 5. The term low acoustic velocity film as used herein refers to a film in which a bulk wave propagates at an acoustic velocity lower than the acoustic velocity of the bulk wave that propagates in the piezoelectric film 5. Elastic waves of various modes with different acoustic velocities are excited from an IDT electrode that is present on a given structure. In this regard, an elastic wave that propagates in the piezoelectric film 5 refers to an elastic wave of a specific mode used to obtain filter or resonator characteristics. Various preferred embodiments of the present invention preferably use a SH wave as an elastic wave, for example.

The high acoustic velocity film 3 acts to confine the surface acoustic wave within the stacked portion of the piezoelectric film 5 and the low acoustic velocity film 4 so that the surface acoustic wave does not leak to the structure below the high acoustic velocity film 3. In the present preferred embodiment, the high acoustic velocity film 3 preferably is made of silicon nitride. However, various high acoustic velocity materials capable of confining the surface acoustic wave mentioned above may be used, such as aluminum nitride, aluminum oxide, silicon carbide, silicon oxynitride, a DLC film, and diamond, media including the above-mentioned materials as main components, and media including mixtures of the above-mentioned materials as main components. The greater the film thickness of the high acoustic velocity film 3, the more desirable from the viewpoint of confining the surface acoustic wave within the stacked portion of the piezoelectric film 5 and the low acoustic velocity film 4. More specifically, the high acoustic velocity film 3 preferably has a film thickness equal to or greater than about 0.5 times, or more preferably equal to or greater than about 1.5 times the wave length $\lambda$ of the surface acoustic wave, for example.

The material of the low acoustic velocity film 4 may be any suitable material with a bulk wave acoustic velocity lower than the acoustic velocity of the bulk wave that propagates in the piezoelectric film 5. Examples of such a material include silicon oxide, glass, silicon oxynitride, and tantalum oxide, compounds with fluorine, carbon, or boron added to silicon oxide, or other media including the above-mentioned materials as main components.

The structure according to the present preferred embodiment with the low acoustic velocity film 4 and the high acoustic velocity film 3 stacked below the piezoelectric film 5 allows for confinement of the surface acoustic wave that is excited in the piezoelectric film 5 as will be described later. That is, the energy of the surface acoustic wave does not easily leak to the portion of the structure below the high acoustic velocity film 3.

In the longitudinally coupled resonator-type surface acoustic wave filter 1, the IDT electrodes 6 to 10 each have a duty factor adjusted over the entire length in the propagation direction of the surface acoustic wave to suppress Rayleigh wave response. This will be explained with reference to FIG. 1B with the IDT electrode 6 taken as a representative example.

The first IDT electrode 6 includes a first busbar 21, and a second busbar 22 extended in parallel or substantially in parallel to the first busbar 21. The first busbar 21 is connected with one end of each of a plurality of first electrode fingers 23a to 23g. The second busbar 22 is connected with one end of each of a plurality of second electrode fingers 24a to 24f. The first electrode fingers 23a to 23g and the second electrode fingers 24a to 24f interdigitate with each other. The propagation direction of the surface acoustic wave is perpendicular or substantially perpendicular to the direction in which the first electrode fingers 23a to 23g and the second electrode fingers 24a to 24f extend.

The IDT electrode 6 has a duty factor that is not uniform over its enter length in the propagation direction of the surface acoustic wave. That is, the widths of the first electrode fingers 23a to 23g are not uniform but varied. The widths of the second electrode fingers 24a to 24g are not uniform, either. In other words, the duty factor varies over the entire length of the IDT electrode 6 in the propagation direction of the surface acoustic wave.

Although the configuration of the electrode fingers of the IDT electrode is described above with reference to the first the IDT electrode 6, the electrode fingers in each of the second to fifth IDT electrodes 7 to 10 are also configured such that the duty factor is not uniform over the entire length of the IDT electrode in the propagation direction of the surface acoustic wave.

Figure 4:
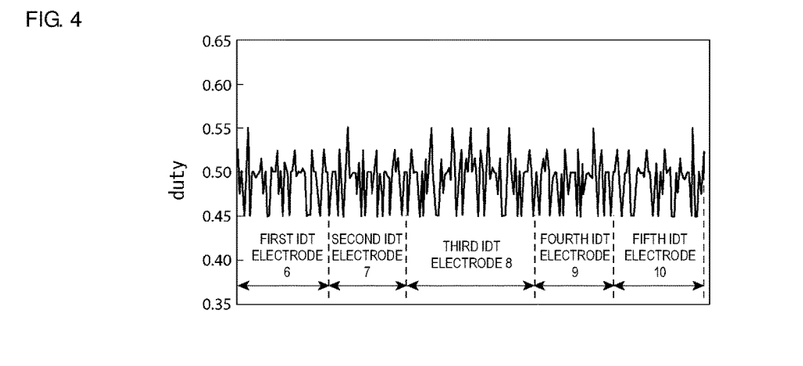
FIG. 4 illustrates duty factor variations in individual each IDT electrodes in the propagation direction of the surface acoustic wave according to the first preferred embodiment of the present invention.

FIG. 4 illustrates duty factor variations in individual IDT electrodes 6 to 10 in the propagation direction of the surface acoustic wave.

Figure 3:
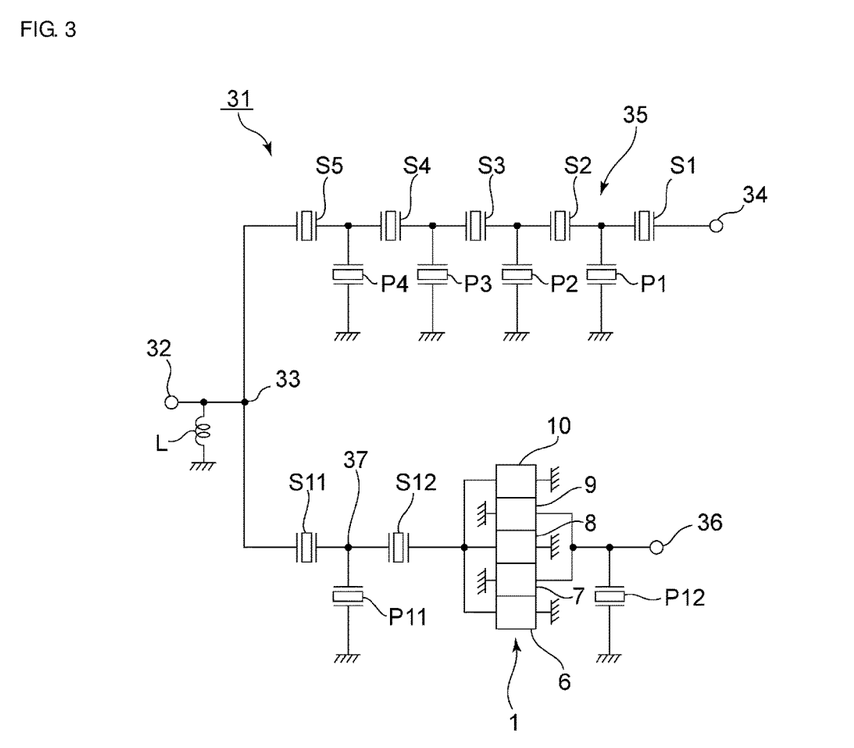
FIG. 3 is a circuit diagram of a duplexer having the longitudinally coupled resonator-type surface acoustic wave filter according to the first preferred embodiment of the present invention.

To verify the effect of the above-mentioned configuration, a duplexer 31 illustrated in FIG. 3 was fabricated. The duplexer 31 includes a common connection terminal 33 connected to an antenna terminal 32. An inductance L is connected between the antenna terminal 32 and a ground potential. A ladder filter 35 is connected between the common connection terminal 33 and a transmitting terminal 34. The ladder filter 35 includes series-arm resonators S1 to S5. First to fourth parallel arms connect the corresponding series arms with the ground potential. The first parallel arm is provided with a first parallel-arm resonator P1. The second to fourth parallel arms are respectively provided with second to fourth parallel-arm resonators P2 to P4.

The series-arm resonators S1 to S5 and the parallel-arm resonators P1 to P4 are each preferably defined by a surface acoustic wave resonator.

A receiving filter is provided between the common connection terminal 33 and a receiving terminal 36. The receiving filter includes the longitudinally coupled resonator-type surface acoustic wave filter 1 according to the preferred embodiment. Series-arm resonators S11 and S12, which are each preferably defined by a surface acoustic wave resonator, are connected between the longitudinally coupled resonator-type surface acoustic wave filter 1 and the common connection terminal 33. A parallel-arm resonator P11 is connected between a node 37 between the series-arm resonators S11 and S12, and the ground potential. A parallel-arm resonator P12 is connected between the output end of the longitudinally coupled resonator-type surface acoustic wave filter 1 and the ground potential.

A non-limiting example of a longitudinally coupled resonator-type surface acoustic wave filter 1 according to the present preferred embodiment was fabricated in accordance with the following specifications.

A Si substrate with a thickness of 200 μm was used as the support substrate 2. A SiN film with a thickness of 1345 nm was used as the high acoustic velocity film 3. A $SiO_2$ film with a thickness of 670 nm was used as the low acoustic velocity film 4. A $LiTaO_3$ substrate with cut-angles of 50° and a thickness of 600 nm was used as the piezoelectric film 5. The material used for the IDT electrodes 6 to 10 and the reflectors 11 and 12 was a stack of a Ti layer with a thickness of 12 nm and an Al alloy layer with a thickness of 162 nm containing 1 weight % of Cu that are stacked in this order from the bottom. Further, a $SiO_2$ film with a thickness of 25 nm was stacked on the electrodes as a protective film.

A crossing width of electrode fingers in the first to fifth IDT electrodes 6 to 10 is about 40 μm.

The first to fifth IDT electrodes 6 to 10 include a narrow-pitch electrode finger portion located between adjacent IDT electrodes. The duty factor was varied in the propagation direction of the surface acoustic wave with the minimum duty factor being about 0.45 and the maximum duty factor being about 0.55, for example. More specifically, the duty factor of each of the IDT electrodes 6 to 10 was varied in the propagation direction of the surface acoustic wave as illustrated in FIG. 4. In the present preferred embodiment, the wavelengths determined by the electrode finger pitches in the first to fifth IDT electrodes 6 to 10 were set as illustrated in Table 1 below.

TABLE 1

| Wavelength | μm |
| --- | --- |
| First/fifth IDT electrode main portion | 1.985 |
| First/fifth IDT electrode narrow-pitch portion | 1.856 |
| Second/fourth IDT electrode outer narrow-pitch portion | 1.781 |
| Second/fourth IDT electrode main portion | 1.940 |
| Second/fourth IDT electrode inner narrow-pitch portion | 1.872 |
| Third IDT electrode narrow-pitch portion | 1.899 |
| Third IDT electrode main portion | 1.974 |

The numbers of pairs of electrode fingers in the first to fifth IDT electrodes 6 to 10 were set as illustrated in Table 2 below.

TABLE 2

| | Number of electrode fingers |
| --- | --- |
| First/fifth IDT electrode main portion | 19 |
| First/fifth IDT electrode narrow-pitch portion | 1.5 |
| Second/fourth IDT electrode outer narrow-pitch portion | 1 |
| Second/fourth IDT electrode main portion | 14.5 |
| Second/fourth IDT electrode inner narrow-pitch portion | 3.5 |
| Third IDT electrode narrow-pitch portion | 4.5 |
| Third IDT electrode main portion | 22 |

The number of electrode fingers in each of the reflectors 11 and 12 was set to 75. Further, the duty factor and wavelength in each of the reflectors were respectively set as about 0.5 and about 1.985 μm, for example.

For comparison, a longitudinally coupled resonator-type surface acoustic wave filter according to a comparative example was fabricated in the same manner as the longitudinally coupled resonator-type surface acoustic wave filter 1 according to the present preferred embodiment, except that the duty factor was set constant at 0.5.

Each of the longitudinally coupled resonator-type surface acoustic wave filters according to the present preferred embodiment and the comparative example was used to fabricate a duplexer for Band 25. In Band 25, the transmit band is from 1850 MHz to 1915 MHz, and the receive band is from 1930 MHz to 1990 MHz.

Figure 5:
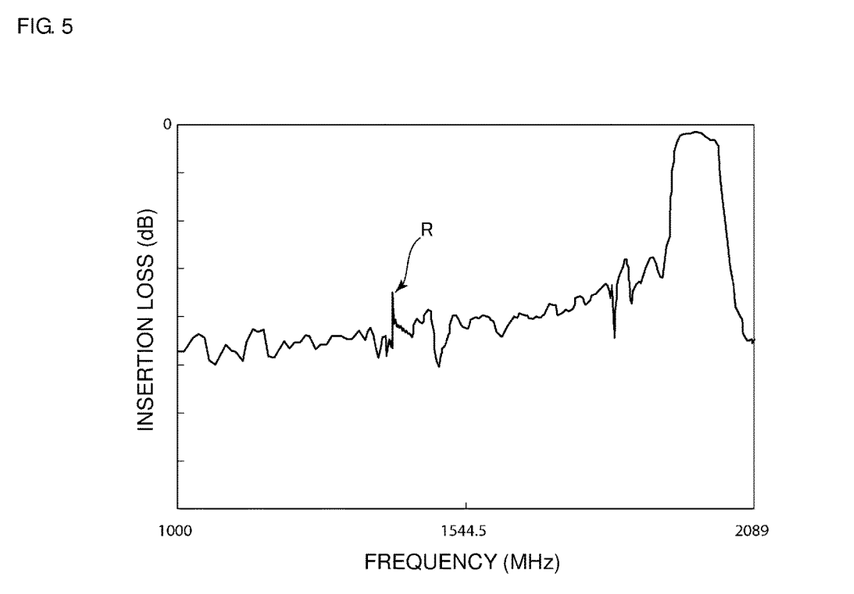
FIG. 5 illustrates the attenuation-frequency characteristics of a longitudinally coupled resonator-type surface acoustic wave filter according to a comparative example.
Figure 6:
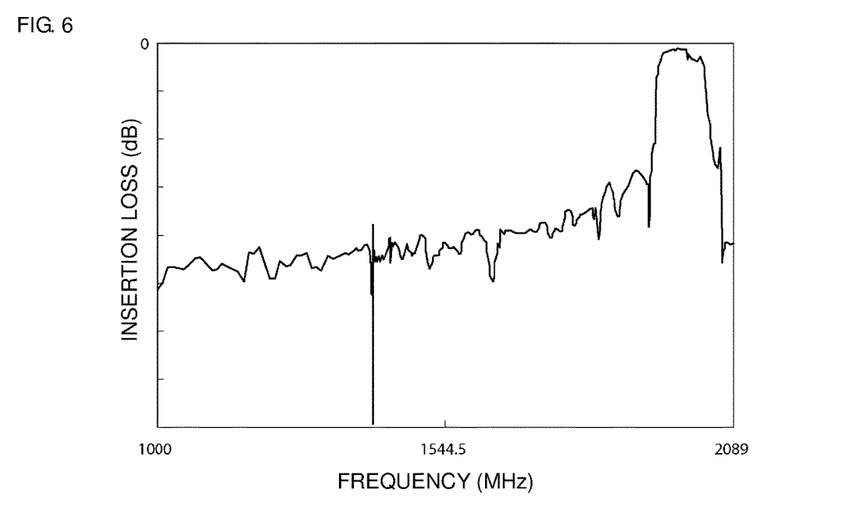
FIG. 6 illustrates the attenuation-frequency characteristics of the longitudinally coupled resonator-type surface acoustic wave filter according to the first preferred embodiment of the present invention.

FIGS. 5 and 6 respectively illustrate the attenuation-frequency characteristics of receiving filters of duplexers fabricated by using the longitudinally coupled resonator-type surface acoustic wave filters according to the comparative example and the present preferred embodiment. It can be appreciated from the receive waveform illustrated in FIG. 5 that large spurious response due to Rayleigh wave as indicated by the arrow R appears at the location of the frequency that is about 0.76 times the pass band frequency. By contrast, it is appreciated from the receive waveform according to the present preferred embodiment illustrated in FIG. 6 that Rayleigh wave spurious response is sufficiently suppressed. More specifically, the present preferred embodiment improves the Rayleigh wave spurious level by approximately 4 dB in comparison to the comparative example. The reason is considered to be follows. That is, the wavelength of narrow-pitch electrode fingers is approximately 0.76 times the wavelength of electrode fingers in the main portion, and this is considered to be why spurious response occurs near the location of about 0.76 times the pass band. In this regard, in the present preferred embodiment, the duty factor is varied in each of the first to fifth IDT electrodes 6 to 10 to make the wavelength of the IDT electrode constant, and this is considered to be why the above-mentioned spurious response is suppressed.

It can be appreciated that using the longitudinally coupled resonator-type surface acoustic wave filter 1 as described above allows for effective reduction of Rayleigh wave spurious level.

Further, the present inventors varied the ratio of the maximum duty factor to the minimum duty factor in the first to fifth IDT electrodes 6 to 10, and measured the Rayleigh wave spurious level in the same manner as mentioned above. The results are illustrated in FIG. 7.

Figure 7:
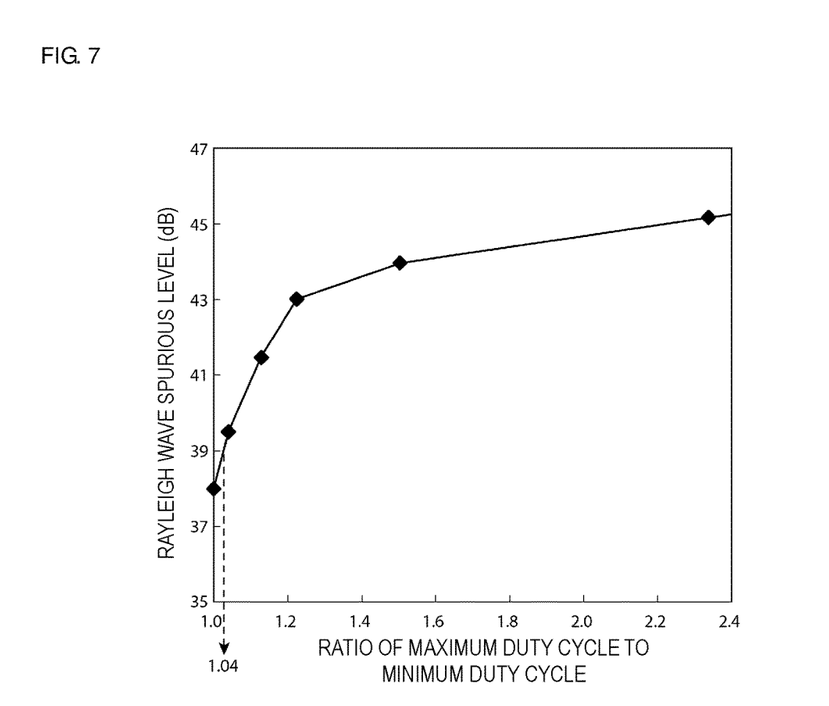
FIG. 7 illustrates the relationship between the ratio of maximum duty factor to minimum duty factor, and Rayleigh wave spurious level.

The Rayleigh wave spurious level (dB) on the vertical axis of FIG. 7 indicates attenuation (dB) in the portion where Rayleigh wave spurious response occurs. A greater value indicates a smaller Rayleigh wave spurious response.

As is apparent from FIG. 7, the greater the ratio of the maximum duty factor to the minimum duty factor, the more effectively the Rayleigh wave spurious response is suppressed. In the present preferred embodiment, the ratio of the maximum duty factor to the minimum duty factor preferably is about 0.55/about 0.45=about 1.22, for example.

It is also appreciated that in order to improve the above-mentioned Rayleigh wave spurious level by 1 dB or more, the ratio of the maximum duty factor to the minimum duty factor preferably is about 1.04 or more, for example. Therefore, for the Rayleigh wave spurious level to be sufficiently suppressed, the above-mentioned ratio of the maximum duty factor to the minimum duty factor is preferably equal to or greater than about 1.04, for example. The greater the ratio of the maximum duty factor to the minimum duty factor, the more preferable from the viewpoint of achieving more effective suppression of the Rayleigh wave spurious level. However, in fabricating an IDT electrode with a varied duty factor, a ratio of the maximum duty factor to the minimum duty factor exceeding about 2.5 makes manufacturing of such an IDT electrode difficult. Therefore, the ratio of the maximum duty factor to the minimum duty factor is preferably equal to or greater than about 1.04 and equal to or less than about 2.5, for example.

Figure 8:
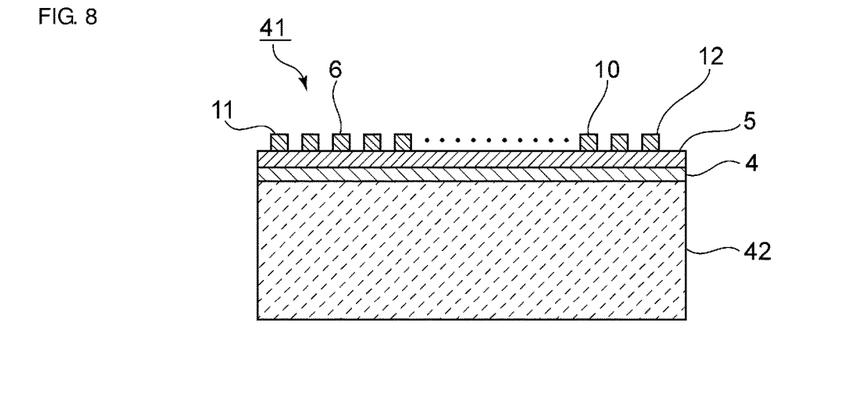
FIG. 8 is a schematic front sectional view of the stacked structure of a longitudinally coupled resonator-type surface acoustic wave filter according to a second preferred embodiment of the present invention.

FIG. 8 is a schematic front sectional view of the stacked structure of a longitudinally coupled resonator-type surface acoustic wave filter according to a second preferred embodiment of the present invention. A longitudinally coupled resonator-type surface acoustic wave filter 41 according to the second preferred embodiment includes a high acoustic velocity support substrate 42. In the high acoustic velocity support substrate 42, a bulk wave propagates at an acoustic velocity higher than the acoustic velocity of the elastic wave that propagates in the piezoelectric film 5. Thus, the high acoustic velocity support substrate 42 is able to be made from the same material as that of the high acoustic velocity film 3. As described above, the support substrate 2 according to the first preferred embodiment may not be provided, and the high acoustic velocity support substrate 42 may be used instead of the support substrate 2.

Although the longitudinally coupled resonator-type surface acoustic wave filters 1 and 41 of a 5-IDT type have been described above, the present invention is also applicable to longitudinally coupled resonator-type surface acoustic wave filters of a 3-IDT type, or longitudinally coupled resonator-type surface acoustic wave filters including more than five IDTs, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A longitudinally coupled resonator-type surface acoustic wave filter comprising:
    a piezoelectric film;
    a high acoustic velocity component in which a bulk wave propagates at an acoustic velocity higher than an acoustic velocity of an elastic wave that propagates in the piezoelectric film;
    a low acoustic velocity film stacked on the high acoustic velocity component and in which a bulk wave propagates at an acoustic velocity lower than an acoustic velocity of a bulk wave that propagates in the piezoelectric film; and
    a plurality of interdigital transducer (IDT) electrodes located on one surface of the piezoelectric film; wherein
    the piezoelectric film is stacked on the low acoustic velocity film; and
    the longitudinally coupled resonator-type surface acoustic wave filter uses a SH wave; and
    at least one of the plurality of IDT electrodes has a duty factor that is adjusted over an entire length of the at least one IDT electrode in a direction of elastic wave propagation to suppress a Rayleigh wave spurious response.

2. The longitudinally coupled resonator-type surface acoustic wave filter according to claim 1, wherein the at least one IDT electrode has a duty factor that is not uniform over the entire length in the direction of elastic wave propagation.

3. The longitudinally coupled resonator-type surface acoustic wave filter according to claim 1, wherein in the at least one IDT electrode, a ratio of a duty factor in a portion of maximum duty factor to a duty factor in a portion of minimum duty factor is in a range of equal to or greater than about 1.04 and equal to or less than about 2.5.

4. The longitudinally coupled resonator-type surface acoustic wave filter according to claim 1, wherein the at least one IDT electrode comprises all of the plurality of IDT electrodes.

5. The longitudinally coupled resonator-type surface acoustic wave filter according to claim 1, further comprising a support substrate stacked on a surface of the high acoustic velocity component opposite to the low acoustic velocity film.

6. The longitudinally coupled resonator-type surface acoustic wave filter according to claim 1, wherein the high acoustic velocity component includes a high acoustic velocity support substrate in which a bulk wave propagates at an acoustic velocity higher than the acoustic velocity of the elastic wave that propagates in the piezoelectric film.

7. The longitudinally coupled resonator-type surface acoustic wave filter according to claim 1, wherein the longitudinally coupled resonator-type surface acoustic wave filter is one of a 3-IDT longitudinally coupled resonator-type surface acoustic wave filter and a 5-IDT longitudinally coupled resonator-type surface acoustic wave filter.

8. The longitudinally coupled resonator-type surface acoustic wave filter according to claim 1, wherein the high acoustic velocity component includes a high acoustic velocity film.

9. The longitudinally coupled resonator-type surface acoustic wave filter according to claim 8, further comprising a support substrate, wherein the high acoustic velocity film, the low acoustic velocity film and the piezoelectric film are stacked in order on the support substrate.

10. The longitudinally coupled resonator-type surface acoustic wave filter according to claim 9, wherein the support substrate is made of sapphire, lithium tantalate, lithium niobate, quartz, alumina, magnesia, silicon nitride, aluminum nitride, silicon carbide, zirconia, cordierite, mullite, steatite, forsterite, glass, silicon, gallium nitride, or resin.

11. The longitudinally coupled resonator-type surface acoustic wave filter according to claim 1, wherein the high acoustic velocity component is made of one of aluminum nitride, aluminum oxide, silicon carbide, silicon oxynitride, a DLC film, and diamond.

12. The longitudinally coupled resonator-type surface acoustic wave filter according to claim 8, wherein the high acoustic velocity film is made of silicon nitride.

13. The longitudinally coupled resonator-type surface acoustic wave filter according to claim 8, wherein the high acoustic velocity film has a film thickness equal to or greater than about 0.5 times a wave length $\lambda$ of the SH wave.

14. The longitudinally coupled resonator-type surface acoustic wave filter according to claim 8, wherein the high acoustic velocity film has a film thickness equal to or greater than about 1.5 times a wave length $\lambda$ of the SH wave.

15. The longitudinally coupled resonator-type surface acoustic wave filter according to claim 1, wherein the low acoustic velocity film is made of one of silicon oxide, glass, silicon oxynitride, tantalum oxide, and a compound including one of fluorine, carbon, and boron added to silicon oxide.

16. The longitudinally coupled resonator-type surface acoustic wave filter according to claim 1, wherein the plurality of IDT electrodes include a narrow-pitch electrode finger portion between adjacent ones of the plurality of IDT electrodes.

17. The longitudinally coupled resonator-type surface acoustic wave filter according to claim 1, wherein the duty factor of the at least one of the plurality of IDT electrodes is adjusted within a range of about 0.45 to about 0.55.

* * * * *